United States Patent
Maeda et al.

(10) Patent No.: US 9,379,248 B2
(45) Date of Patent: Jun. 28, 2016

(54) THIN-FILM TRANSISTOR STRUCTURE, AS WELL AS THIN-FILM TRANSISTOR AND DISPLAY DEVICE EACH HAVING SAID STRUCTURE

(75) Inventors: Takeaki Maeda, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/113,303

(22) PCT Filed: Apr. 19, 2012

(86) PCT No.: PCT/JP2012/060576
§ 371 (c)(1),
(2), (4) Date: Oct. 22, 2013

(87) PCT Pub. No.: WO2012/144556
PCT Pub. Date: Oct. 26, 2012

(65) Prior Publication Data
US 2014/0054588 A1    Feb. 27, 2014

(30) Foreign Application Priority Data
Apr. 22, 2011  (JP) ................. 2011-096442

(51) Int. Cl.
*H01L 29/786* (2006.01)
*G02F 1/1368* (2006.01)
*H01L 27/12* (2006.01)

(52) U.S. Cl.
CPC .......... *H01L 29/7869* (2013.01); *G02F 1/1368* (2013.01); *H01L 27/1222* (2013.01); *H01L 29/78693* (2013.01)

(58) Field of Classification Search
CPC ............ H01L 29/7869; H01L 27/1225; H01L 21/02565; H01L 29/78693
See application file for complete search history.

(56) References Cited

U.S. PATENT DOCUMENTS 7,061,565 B2    6/2006  Kwon et al.
8,232,551 B2    7/2012  Kim et al.
(Continued)

FOREIGN PATENT DOCUMENTS

CN    101630692 A    1/2010
CN    101752428 A    6/2010
(Continued)

OTHER PUBLICATIONS

International Search Report and Written Opinion issued Jul. 10, 2012 in PCT/JP2012/060576 (with English language translation).
(Continued)

*Primary Examiner* — Tucker J Wright
(74) *Attorney, Agent, or Firm* — Oblon, McClelland, Maier & Neustadt, L.L.P.

(57) ABSTRACT

There is provided an oxide semiconductor layer capable of making stable the electric characteristics of a thin-film transistor without requiring an oxidatively-treated layer when depositing a passivation layer or the like in display devices such as organic EL displays depositing and liquid crystal displays. The thin-film transistor structure of the present invention at least having, on a substrate, an oxide semiconductor layer, a source-drain electrode, and a passivation layer in order from the substrate side, wherein the oxide semiconductor layer is a stacked product of a first oxide semiconductor layer and a second oxide semiconductor layer; the first oxide semiconductor layer has a Zn content of 50 atomic % or more as a percentage of all metal elements contained therein, and the first oxide semiconductor layer is formed on the source-drain electrode and passivation layer side; the second oxide semiconductor layer contains at least one element selected from the group consisting of In, Ga, and Zn, and the second oxide semiconductor layer is formed on the substrate side; and the first oxide semiconductor layer is in direct contact both with the source-drain electrode and with the passivation layer.

16 Claims, 1 Drawing Sheet

(56) References Cited

U.S. PATENT DOCUMENTS

| | | |
|---|---|---|
| 8,304,300 B2 | 11/2012 | Sakata et al. |
| 8,319,217 B2 | 11/2012 | Kim et al. |
| 8,362,478 B2 | 1/2013 | Yamazaki et al. |
| 8,514,340 B2 | 8/2013 | Kwon et al. |
| 8,558,382 B2 | 10/2013 | Maeda et al. |
| 2004/0191530 A1 | 9/2004 | Inoue et al. |
| 2005/0018097 A1 | 1/2005 | Kwon et al. |
| 2006/0192907 A1 | 8/2006 | Kwon et al. |
| 2008/0237598 A1 | 10/2008 | Nakayama |
| 2009/0197757 A1 | 8/2009 | Fukushima |
| 2009/0227053 A1 | 9/2009 | Kwon et al. |
| 2009/0267064 A1 | 10/2009 | Yano et al. |
| 2009/0308635 A1 | 12/2009 | Yano et al. |
| 2009/0321732 A1 | 12/2009 | Kim et al. |
| 2010/0006834 A1* | 1/2010 | Kim et al. ............... 257/43 |
| 2010/0148170 A1 | 6/2010 | Ueda et al. |
| 2010/0170696 A1 | 7/2010 | Yano et al. |
| 2010/0181565 A1 | 7/2010 | Sakata et al. |
| 2010/0264412 A1 | 10/2010 | Yamazaki et al. |
| 2010/0276685 A1 | 11/2010 | Itagaki et al. |
| 2011/0003418 A1 | 1/2011 | Sakata et al. |
| 2011/0024751 A1 | 2/2011 | Yamazaki |
| 2011/0073856 A1 | 3/2011 | Sato et al. |
| 2011/0121244 A1 | 5/2011 | Yano et al. |
| 2011/0127579 A1 | 6/2011 | Yamazaki |
| 2011/0140095 A1 | 6/2011 | Kim et al. |
| 2011/0141076 A1 | 6/2011 | Fukuhara et al. |
| 2011/0156027 A1* | 6/2011 | Yamazaki et al. ............... 257/43 |
| 2011/0168997 A1* | 7/2011 | Lee et al. ............... 257/57 |
| 2011/0193083 A1 | 8/2011 | Kim et al. |
| 2011/0284836 A1 | 11/2011 | Lee |
| 2012/0119207 A1 | 5/2012 | Goto et al. |
| 2012/0280227 A1 | 11/2012 | Wakana et al. |
| 2013/0009111 A1 | 1/2013 | Morita et al. |
| 2013/0032798 A1 | 2/2013 | Miki et al. |
| 2013/0037799 A1 | 2/2013 | Sakata et al. |
| 2013/0119324 A1 | 5/2013 | Morita et al. |
| 2013/0126863 A1 | 5/2013 | Yamazaki et al. |
| 2013/0181218 A1 | 7/2013 | Maeda et al. |
| 2013/0228926 A1 | 9/2013 | Maeda et al. |
| 2013/0234081 A1 | 9/2013 | Goto et al. |
| 2014/0113687 A1 | 4/2014 | Sakata et al. |

FOREIGN PATENT DOCUMENTS

| | | |
|---|---|---|
| CN | 101944506 A | 1/2011 |
| CN | 102097487 A | 6/2011 |
| JP | 2004-163901 A | 6/2004 |
| JP | 2007-142196 A | 6/2007 |
| JP | 2009-164393 A | 7/2009 |
| JP | 2010-016347 A | 1/2010 |
| JP | 2010-018479 A | 1/2010 |
| JP | 2010-021555 A | 1/2010 |
| JP | 2010-50165 A | 3/2010 |
| JP | 2010-123913 A | 6/2010 |
| JP | 2010-161339 A | 7/2010 |
| JP | 2010-186994 A | 8/2010 |
| JP | 2010-267955 A | 11/2010 |
| JP | 2011-029635 A | 2/2011 |
| JP | 2011-129926 A | 6/2011 |
| JP | 2012-099661 A | 5/2012 |
| KR | 10-2010-0007703 A | 1/2010 |
| TW | 200915579 A | 4/2009 |
| TW | 201017885 A1 | 5/2010 |
| TW | 201041139 A | 11/2010 |
| TW | 201108417 A | 3/2011 |
| TW | 201110243 A | 3/2011 |
| WO | WO 2010/098100 A1 | 9/2010 |
| WO | WO 2011/039853 A1 | 4/2011 |
| WO | WO 2011/065329 A1 | 6/2011 |

OTHER PUBLICATIONS

Kenji Nomura, et al., "Room-temperature fabrication of transparent flexible thin-film transistors using amorphous oxide semiconductors" Nature, vol. 432, Nov. 25, 2004, pp. 488-492.

Kenji Nomura, et al., "Amorphous Oxide Semiconductors for High-Performance Flexible Thin-Film Transistors" Japanese Journal of Applied Physics, vol. 45, No. 5B, 2006, pp. 4303-4308.

U.S. Appl. No. 14/399,378, filed Nov. 6, 2014, Goto, et al.

* cited by examiner

THIN-FILM TRANSISTOR STRUCTURE, AS WELL AS THIN-FILM TRANSISTOR AND DISPLAY DEVICE EACH HAVING SAID STRUCTURE

TECHNICAL FIELD

The present invention relates to thin-film transistor (TFT) structures, as well as thin-film transistors and display devices each having any of these structures. The TFT structures of the present invention are typically used for flat panel displays such as liquid crystal displays (liquid crystal display devices) and organic EL displays. The following will describe the present invention by showing a liquid crystal display device as a typical example, but the present invention is not limited to this typical example.

BACKGROUND ART

As semiconductor layers used for display devices, much attention has been paid to oxide semiconductors. Compared with widely used amorphous silicon (a-Si), oxide semiconductors have high carrier mobility, high optical band gaps, and easy film formability at low temperatures, and therefore, have highly been expected to be applied for next generation displays, which are required to have large sizes, high resolution, and high-speed drives; low heat-resistant resin substrates; and other uses.

Oxide semiconductors each contain at least one element selected from the group consisting of In, Ga, Zn, and Sn, and typical examples of the oxide semiconductors may include, for example, In-containing oxide semiconductors (In—Ga—Zn—O, In—Zn—Sn—O, and In—Zn—O etc,). There have also been proposed Zn-containing oxide semiconductors (Zn—Sn—O and Ga—Zn—Sn—O etc,) as the oxide semiconductor containing no In as a rare metal, thereby making a reduction in material cost and being suitable for mass production (e.g., Patent Document 1).

PRIOR ART DOCUMENT

Patent Document

Patent Document 1; Japanese Patent Laid-open Publication (Kokai) No. 2004-163901

SUMMARY OF THE INVENTION

Problems to be Solved by the Invention

When an oxide semiconductor is used as an oxide semiconductor layer of a TFT, the oxide semiconductor is required not only to have high carrier concentration, but also to provide the TFT with excellent switching properties (transistor characteristics). More specifically, the oxide semiconductor is required to have, for example, (1) high mobility, (2) low SS value (Subthreshold Swing, gate voltage required to increase drain current by one digit), and (3) excellent stability to stress such as voltage application and light irradiation (stress stability).

When an oxide semiconductor is used as an oxide semiconductor layer of a TFT, a source-drain electrode, a passivation layer, an etch stop layer, and other layers are formed on or above the oxide semiconductor layer in the production of the TFT (the layers (films) formed on or above the oxide semiconductor layer so that at least part of the layers (films) comes into contact with the oxide semiconductor layer may hereinafter be referred to collectively as the "upper layers"). The surface of the oxide semiconductor layer is highly damaged when depositing the upper layers to cause the occurrence of defects such as oxygen vacancy, resulting in a large shift of the threshold voltage or a deterioration of the switching properties.

More specifically, for example, when a passivation layer is formed by a plasma CVD (Chemical Vapor Deposition) method, radicals and molecules made to have high speed by plasma will collide to the surface of an oxide semiconductor, and therefore, some defect (typically, oxygen vacancy etc,) may be formed in the surface of the oxide semiconductor layer, or hydrogen contained in the gas for film deposition may be introduced into the surface of the oxide semiconductor layer. As a result, some problems will occur. For example, the surface of the oxide semiconductor layer easily becomes conductive. This is probably assumed to be because the oxygen defects formed in the surface of the oxide semiconductor layer or hydrogen introduced into the surface of the oxide semiconductor layer acts as donors in the oxide semiconductor.

When an oxide semiconductor layer becomes conductive as described above, it seriously affects TFT characteristics, such as showing no switching properties or great shift of threshold voltage to the negative side.

Thus, to inhibit damage to the surface of an oxide semiconductor layer when depositing the upper layers, there has been proposed a method of excessively oxidizing the surface of the oxide semiconductor layer by, for example, depositing an oxidatively-treated layer (which is different from an oxidized layer formed by thermal hysteresis in the ordinary TFT production process) on the surface of the oxide semiconductor layer by irradiation of $N_2O$ plasma on the surface of the oxide semiconductor layer before depositing the upper layers. However, the deposition of an oxidatively-treated layer as described above causes a problem of mobility deterioration or stress stability lowering as compared with before depositing the upper layers. Since there is a need to add an $N_2O$ plasma treatment step before depositing the upper layers, some other problems will occur, such as lowering of productivity and increase of production cost.

The present invention has been made under the above situation. The object of the present invention is to provide a novel technique that can easily and surely reduce, without depositing an oxidatively-treated layer as described above on the surface of an oxide semiconductor layer, defect (damage) occurrence and hydrogen introduction, both of which are caused in the surface of an oxide semiconductor layer when depositing the upper layers, as well as reduce a deterioration of TFT characteristics, which is caused in association with the defect occurrence and hydrogen introduction.

Means for Solving the Problems

One thin-film transistor structure of the present invention, which can solve the above problems, is a thin-film transistor structure at least having, on a substrate, an oxide semiconductor layer, a source-drain electrode, and a passivation layer in order from the substrate side, wherein the oxide semiconductor layer is a stacked product of a first oxide semiconductor layer and a second oxide semiconductor layer;

the first oxide semiconductor layer has a Zn content of not lower than 50 atomic % as a percentage of all metal elements contained therein, and the first oxide semiconductor layer is formed on the source-drain electrode and passivation layer side;

the second oxide semiconductor layer contains at least one element selected from the group consisting of In, Ga, and Zn, and the second oxide semiconductor layer is formed on the substrate side; and the first oxide semiconductor layer is in direct contact both with the source-drain electrode and with the passivation layer.

Another thin-film transistor structure of the present invention, which can solve the above problems, is a thin-film transistor structure at least having, on a substrate, an oxide semiconductor layer, an etch stop layer, and a source-drain electrode in order from the substrate side, wherein the oxide semiconductor layer is a stacked product of a first oxide semiconductor layer and a second oxide semiconductor layer;

the first oxide semiconductor layer has a Zn content of 50 atomic % or more as a percentage of all metal elements contained therein, and the first oxide semiconductor layer is formed on the etch stop layer and source-drain electrode side;

the second oxide semiconductor layer contains at least one element selected from the group consisting of In, Ga, and Zn, and the second oxide semiconductor layer is formed on the substrate side; and the first oxide semiconductor layer is in direct contact both with the etch stop layer and with the source-drain electrode.

In a preferred embodiment of the present invention, the first oxide semiconductor layer may further contain, as a metal element, at least one element selected from the group consisting of Al, Ga, and Sn.

The thin-film transistor structures of the present invention can exhibit excellent characteristics even when the passivation layer or the etch stop layer is formed by a CVD (Chemical Vapor Deposition) method.

The present invention further includes thin-film transistors each having a thin-film transistor structure as described above, and display devices each having a thin-film transistor.

The term "direct contact" as used herein means that a source-drain electrode, a passivation layer, or an etch stop layer is formed on a first oxide semiconductor layer without an intervening layer, such as an oxidatively-treated layer, which is formed by $N_2O$ plasma irradiation as described above or other methods.

Effects of the Invention

The present invention makes it possible to provide high-quality display devices, of which TFT characteristics after upper layer deposition are kept stable without depositing an oxidatively-treated layer by $N_2O$ plasma irradiation, because a first oxide semiconductor layer is allowed to intervene as a layer of inhibiting the introduction of damage or hydrogen into a second oxide semiconductor layer containing at least one element selected from the group consisting of In, Ga, and Zn in a thin-film transistor having an oxide semiconductor layer.

MODE FOR CARRYING OUT THE INVENTION

The present inventors have made intensive studies to easily and surely reduce the deterioration of TFT characteristics due to the damage or the like in the surface of a semiconductor layer when an oxide containing at least one element selected from the group consisting of In, Ga, and Zn is used for the active layer (oxide semiconductor layer) of a TFT, followed by deposition of the upper layers, such as a passivation layer and an etch stop layer, on or above the oxide semiconductor layer.

As a result, they have found the following fact: when after the deposition of an oxide semiconductor layer made of an oxide containing at least one element selected from the group consisting of In, Ga, and Zn (a second oxide semiconductor layer) as described above, but before depositing the upper layers, such as a passivation layer, an oxide semiconductor layer having a Zn content of 50 atomic % or more as a percentage of all metal elements contained therein (a first oxide semiconductor layer) is formed on the second oxide semiconductor layer, then it becomes possible to prevent plasma damage from being provided, or hydrogen from being introduced, into the second oxide semiconductor layer when depositing the upper layers without depositing an oxidatively-treated layer by $N_2O$ plasma irradiation before depositing the upper layers, resulting in obtaining stable TFT characteristics and achieving the desired object, thereby completing the present invention.

The following will describe the respective layers in detail.

[First Oxide Semiconductor Layer]

The oxide depositing the first oxide semiconductor layer is an oxide at least containing Zn, in which the Zn content as a percentage of all metal elements depositing the first oxide semiconductor layer is 50 atomic % or more. As shown in Examples below, when the Zn content is lower than 50 atomic %, some problems will occur. For example, resistance to reductive atmosphere becomes low, and the introduction of hydrogen when depositing the upper layers makes the transistor conductive, resulting in not showing switching properties. The Zn content may be preferably 60 atomic % or more, more preferably 75 atomic % or more. The oxide depositing the first oxide semiconductor layer may further contain, in addition to Zn, one or more metal elements selected from the group consisting of, for example, Al, Ga, and Sn, as elements not deteriorating the working effect of the present invention. More preferred examples of the first oxide semiconductor layer may include those made of Zn—O, Zn—Al—O, Zn—Ga—O, and Zn—Sn—O.

Figure 1:
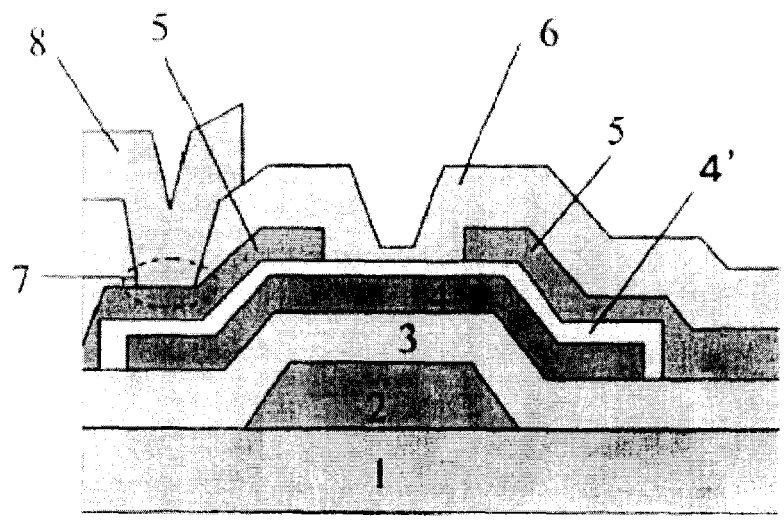
FIG. 1 is a schematic cross-sectional view for explaining an embodiment of one thin-film transistor structure in the production process.

The oxide semiconductor layer of the present invention does not require any oxidatively-treated layer as described above, and therefore, the first oxide semiconductor layer is in direct contact with the upper layers (e.g., a passivation layer) as shown in FIG. 1 below.

The first oxide semiconductor layer may have a film thickness of 5 nm or more. This is because when the film thickness is too small, it is difficult to sufficiently exhibit a barrier effect against plasma damage or hydrogen introduction when depositing the upper layers. The film thickness may be more preferably 10 nm or more. On the other hand, when the film thickness is too great, production cost increases because of much time being required for film deposition. Therefore, the first oxide semiconductor layer may preferably have a film thickness of 80 nm or less, more preferably than 40 nm or less.

[Second Oxide Semiconductor Layer]

The oxide depositing the second semiconductor layer is an oxide containing at least one element selected from the group consisting of In, Ga, and Zn. Specific examples of the oxide depositing the second oxide semiconductor layer may include, for example, In-containing oxide semiconductors (In—Ga—Zn—O and In—Zn—O etc,) and In-free Zn-containing oxide semiconductors (ZnO and Al—Ga—Zn—O etc,) and so on. The compositions of these specific examples are not particularly limited, but there can be used those which fall within the range usually used.

The second oxide semiconductor layer may preferably have a film thickness of 30 nm or more. This is because when the film thickness is too small, there is a possibility that characteristics may vary in the substrate surface. On the other hand, when the film thickness is too great, production cost increases because of much time being required for film deposition. Therefore, the second oxide semiconductor layer may preferably have a film thickness of 200 nm or less, more preferably 80 nm or less.

[Method of Depositing First and Second Oxide Semiconductor Layers]

The first and second oxide semiconductor layers may preferably be formed by a sputtering method using a sputtering target (which may hereinafter be referred to as the "target"). The use of a supporting method makes it possible to easily form a thin film having excellent uniformity of composition or film thickness in the film surface. The oxide semiconductor layers can also be formed by a chemical film-deposition method such as a coating method.

As a target to be used in the sputtering method, there may preferably be used a sputtering target containing the elements described above and having the same composition as that of a desired oxide, thereby making it possible to form a thin film causing no deviation of composition and having the same composition as that of the desired oxide. Specific examples of the target to be used for the deposition of the first oxide semiconductor layer may include oxide targets each having a Zn content of 50 atomic % or more as a percentage of all metal elements contained therein. Specific examples of the target to be used for the deposition of the second oxide semiconductor layer may include oxide targets each containing at least one element selected from the group consisting of In, Ga, and Zn.

The targets described above can be produced by, for example, a powder sintering method.

When the first and second oxide semiconductor layers are formed by a sputtering method, the film deposition may desirably be carried out successively while keeping the vacuum state. Exposure to the air when depositing the first and second oxide semiconductor layers causes the attachment of water in the air or organic matter onto the thin film surface, resulting in contamination.

The sputtering using a target as described above may preferably be carried out under the conditions that substrate temperature is set to room temperature and oxygen addition amount is appropriately controlled. The oxygen addition amount may appropriately be controlled according to the configuration of a sputtering system and the composition of the target. The oxygen addition amount may preferably be controlled by the addition of oxygen so that the carrier concentration of an oxide semiconductor becomes approximately from $10^{15}$ to $10^{16}$ cm$^{-3}$. In Examples below, the oxygen addition amount was set to fulfill $100 \times O_2/(Ar+O_2)=4\%$ by the addition flow ratio.

[Upper Layers]

Examples of the upper layers to be formed on the first oxide semiconductor layer in the present invention may include a passivation layer, an etch stop layer, and a source-drain electrode.

The passivation layer is formed for the purpose of stably ensuring TFT characteristics. The passivation layer used in the present invention is not particularly limited to specific types, but there can be used those which have usually been used in display devices. For example, any of $SiO_x$, $SiN_x$, and $SiON_x$ layers can be formed, or two or more of these layers can be formed as a stacked product.

The passivation layer may usually be formed using, for example, a CVD method (more specifically, e.g., a plasma CVD method) or a sputtering method. Specific examples of the method for depositing an $SiO_x$ layer by the plasma CVD method may include methods of reacting a mixed gas of $SiH_4$ and $N_2O$ in a high frequency plasma at an industrial frequency of 13.56 MHz to form $SiO_x$, which is deposited on the oxide semiconductor layer.

The present invention makes it possible to prevent the damage or hydrogen introduction into the second oxide semiconductor layer to ensure excellent TFT characteristics, even when the passivation layer is formed by, for example, a CVD method as described above.

The etch stop layer is formed for the purpose of preventing damage to an oxide semiconductor layer, for example, in the etching when depositing a source-drain electrode. The etch stop layer used in the present invention is not particularly limited to specific types, but there can be used those which have usually be used in display devices. For example, as the etch stop layer, for example, any of $SiO_x$, $SiN_x$, and $SiON_x$ layers can be formed, or two or more of these layers can be formed as a stacked product.

The etch stop layer may usually be formed using, for example, a CVD method (more specifically, e.g., a plasma CVD method) or a sputtering method.

The present invention makes it possible to prevent the damage or hydrogen introduction into the second oxide semiconductor layer to ensure excellent TFT characteristics, even when the etch stop layer is formed by, for example, a CVD method as described above.

The source-drain electrode is also not particularly limited to specific type, but there can be used those which have usually been used. For example, metals such as Al and Cu, or their alloys, may be used, or pure Mo may also be used as in Examples below. The source-drain electrode can usually be formed by, for example, a sputtering method. The present invention makes it possible to prevent the damage or hydrogen introduction into the second oxide semiconductor layer to ensure excellent TFT characteristics, even when the source-drain electrode is formed by, for example, a sputtering method.

The TFT structure of the present invention is characterized in that it has an oxide semiconductor layer (a first semiconductor layer and a second semiconductor layer) and upper layers as descried above, and in that the first oxide semiconductor layer is in direct contact with the upper layers (more specifically, when the TFT structure does not have an etch stop layer, the first oxide semiconductor layer is in direct contact both with the source-drain electrode and with the passivation layer, or when the TFT structure has an etch stop layer, the first oxide semiconductor layer is in direct contact both with the etch stop layer and with the source-drain electrode). The other components in TFTs are not particularly limited.

Therefore, TFTs each may at least have a gate electrode, a gate insulator layer, an oxide semiconductor layer as described above, a source-drain electrode as described above, an optional etch stop layer as described above, a passivation layer as described above, and a transparent conductive film. The TFT structures are not particularly limited, so long as they have usually been used. Even in the display devices having these TFTs, the constituent features other than those which are defined in the present invention are not particularly limited.

Figure 2:
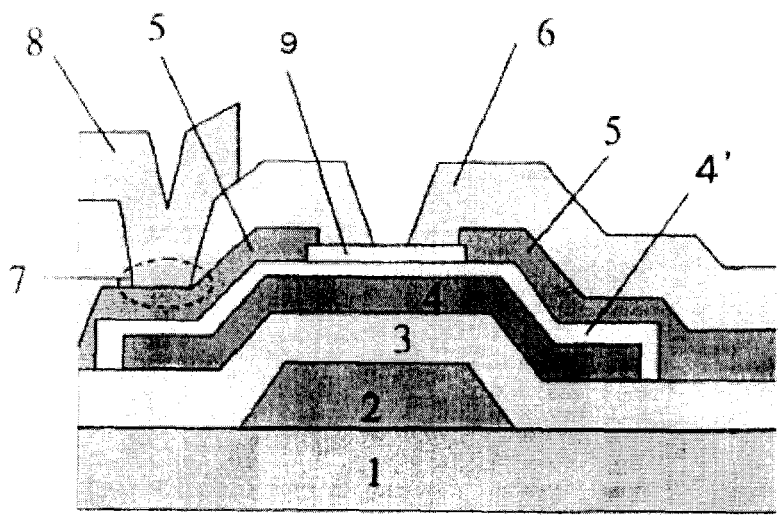
FIG. 2 is a schematic cross-sectional view for explaining an embodiment of another thin-film transistor structure in the production process.

The following will describe, by reference to FIGS. 1 and 2, an embodiment of a process for producing a TFT as described above. FIGS. 1 and 2, and the following production process, indicate one example of the preferred embodiments of the present invention, and they are not intended to limit the present invention. For example, FIGS. 1 and 2 show TFTs each having a bottom gate type structure; however, the present invention is not limited thereto, and the TFTs of the present invention may be top gate type TFTs each having a gate insulator layer and a gate electrode successively on an oxide semiconductor layer. Even in the TFTs of the top gate type, the oxide semiconductor layer may be composed of a first oxide semiconductor layer and a second oxide semiconductor layer, and the first oxide semiconductor layer may be in direct contact with the upper layers.

As shown in FIG. 1, a gate electrode 2 and a gate insulator layer 3 are formed on a substrate 1, and a second oxide semiconductor layer 4 and a first oxide semiconductor layer 4' are formed thereon. A source-drain electrode 5 is formed on the first oxide semiconductor layer 4', and a passivation layer (insulator layer) 6 is formed thereon, and a transparent conductive film 8 is electrically connected to the drain electrode 5 through a contact hole 7.

The method of depositing the gate electrode 2 and the gate insulator layer 3 on the substrate 1 is not particularly limited, and any of the methods usually used can be employed. The gate electrode 2 and the gate insulator layer 3 are not particularly limited to specific types, and there can be used those which have widely been used. For example, metals having low electric resistance, such as Al and Cu, and their alloys, can preferably be used for the gate electrode 2. As in Examples below, pure Mo may also be used. Typical examples of the gate insulator layer 3 may include a silicon oxide film, a silicon nitride film, and a silicon oxynitride film. In addition, there can also be used oxides such as $Al_2O_3$ and $Y_2O_3$, and those which are formed by layering them.

Then, the oxide semiconductor layer (the second oxide semiconductor layer 4 and the first oxide semiconductor layer 4') is formed. The second oxide semiconductor layer 4 can be formed by a DC sputtering method or an RF sputtering method using a sputtering target having the same composition as that of the second oxide semiconductor layer, as described above. As described above, the second oxide semiconductor layer 4 and the first oxide semiconductor layer 4' may preferably be successively formed all in a vacuum.

The second oxide semiconductor layer 4 and the first oxide semiconductor layer 4' are subjected to wet etching and then patterning. Just after the patterning, heat treatment (pre-annealing) may preferably be carried out to improve the film quality of the second oxide semiconductor layer 4 and the first oxide semiconductor layer 4', resulting in an increase of on-state current and electron field-effect mobility in transistor characteristics and an improvement in transistor performance. As the conditions of pre-annealing as described above, heat treatment may be carried out, for example, under air or oxygen atmosphere at a temperature of about from 250° C. to 400° C. for a time of about from 1 to 2 hours.

FIG. 2 shows another structure of the thin-film transistor, i.e., the TFT structure in which an etch stop layer 9 is further added to the structure in FIG. 1 above. As shown in this FIG. 2, when the TFT structure having the etch stop layer 9 is formed, the etch stop layer 9 may be formed after the pre-annealing. As the etch stop layer 9, usually used are $SiO_2$ or other insulator layers. The source-drain electrode 5 may be formed on the first oxide semiconductor layer 4' in advance of the etch stop layer 9; however, transistor characteristics may probably be degraded because the first oxide semiconductor layer 4' is damaged during the etching of the electrode 5 described above. Therefore, the etch stop layer 9 may preferably be formed as the passivation layer in advance of the source-drain electrode 5 to prevent the above-described damage to the first oxide semiconductor layer 4' during the etching.

When the source-drain electrode 5 is processed by a lift-off method, the first oxide semiconductor layer 4' is not damaged, and therefore, there is no need to form the etch stop layer 9. In Examples below, the source-drain electrode 5 was formed by a lift-off method, and then, the passivation layer 6 was formed.

The source-drain electrode is not particularly limited to specific types, but there can be used those which have widely been used. For example, metals such as Al and Cu, or their alloys, may be used similarly to the gate electrode, or pure Mo may also be used as in Examples below. A sputtering method is widely used to form the electrode.

After that, the passivation layer (insulator layer) 6 is formed to have a film thickness of from 100 nm to 400 nm (as the total film thickness when it is composed of two or more layers) on the source-drain electrode 5 and the first oxide semiconductor layer 4' by a CVD method. The passivation layer 6 can be formed of a material such as $SiO_2$, SiN, or SiON by a CVD method. The passivation layer 6 may also be formed by a sputtering method.

Then, according to an ordinary method, the transparent conductive film 8 is electrically connected to the drain electrode 5 through the contact hole 7. The transparent conductive film is not particularly limited to specific types, but there can be used those which have usually be used.

The present application claims the benefit of priority based on Japanese Patent Application No. 2011-096442 filed on Apr. 22, 2011. The entire contents of the specification of Japanese Patent Application No. 2011-096442 filed on Apr. 22, 2011 are incorporated herein by reference.

EXAMPLES

The present invention will hereinafter be described more specifically by way of Examples, but the present invention is not limited to the following Examples. The present invention can be put into practice after appropriate modifications or variations within a range meeting the gist described above and below, all of which are included in the technical scope of the present invention.

In the present Examples, samples prepared by the following method were used for measurement of TFT characteristics.

More specifically, thin-film transistors (TFTs) as shown in FIG. 1 were prepared for evaluation of TFT characteristics.

First, a Mo thin film of 100 nm in thickness as a gate electrode 2 and an $SiO_2$ film (200 nm) as a gate insulator layer 3 were successively formed on a glass substrate 1 ("EAGLE XG" available from Corning Incorporated, having a diameter 100 mm and a thickness of 0.7 mm). The gate electrode 2 was formed by a DC sputtering method using a pure Mo sputtering target under the conditions: film deposition temperature, room temperature; film deposition power, 300 W; carrier gas, Ar; and gas pressure, 2 mTorr. The gate insulator layer 3 was formed by a plasma CVD method under the conditions: carrier gas, a mixed gas of $SiH_4$ and $N_2O$; film deposition power, 100 W; and film deposition temperature, 300° C.

Then, a second oxide semiconductor layer 4 having a different composition as shown in Tables 1 to 5 was formed on the above gate insulator layer 3 by a sputtering method using a sputtering target as described below. The sputtering conditions were as described below, and the target composition was adjusted to obtain the desired second oxide semiconductor layer 4.

Target: In—Ga—Zn—O (IGZO) or In—Zn—O (IZO)
Substrate temperature: room temperature
Gas pressure: 5 mTorr
Oxygen partial pressure: $100 \times O_2/(Ar+O_2)=4\%$
Film thickness: 40 nm Then, a first oxide semiconductor layer 4' as shown in Tables 1 to 5 was formed on the above second oxide semiconductor layer 4 by a sputtering method using a sputtering target as described below. The sputtering conditions were as described below, and the target composition was adjusted to obtain the desired first oxide semiconductor layer 4'.

Target: Zn—O (ZnO),
Ga—Zn—O (GZO),
Al—Zn—O (AZO), or
Zn—Sn—O (ZTO)
Substrate temperature: room temperature
Gas pressure: 5 mTorr
Oxygen partial pressure: $100 \times O_2/(Ar+O_2)=4\%$
Film thickness: 20 nm The second oxide semiconductor layer 4 and the first oxide semiconductor layer 4' were successively formed without opening the chamber to the air.

After the second oxide semiconductor layer 4 and the first oxide semiconductor layer 4' were formed as described above, patterning was carried out by photolithography and wet etching. "ITO-07N" and "ELM-EZ1" available from Kanto Chemical Co., Inc. were used as wet etchants.

The patterning was followed by pre-annealing treatment to improve the film quality. The pre-annealing treatment was carried out at 350° C. in air atmosphere for 1 hour.

Then, a source-drain electrode 5 was formed by a lift-off method using pure Mo. More specifically, after patterning was carried out using a photoresist, a Mo thin film was formed by a DC sputtering method (the film thickness was 100 nm). The method of depositing the Mo thin film as the source-drain electrode was the same as used for the gate electrode described above. Then, an unnecessary photoresist was removed with an ultrasonic washing apparatus in acetone. For each TFT, the channel length was set to 10 μm and the channel width was set to 200 μm.

After the source-drain electrode 5 was formed as described above, a passivation layer 6 was formed for protection of the oxide semiconductor layers (4 and 4'). As the passivation layer 6, a stacked product (400 nm in total film thickness) of $SiO_2$ (200 nm in film thickness) and SiN (200 nm in film thickness) was used. The $SiO_2$ and SiN layers were formed by a plasma CVD method using "PD-220NL" available from SAMCO Inc. In the present Examples, the $SiO_2$ layer and the SiN layer was successively formed without making plasma treatment with $N_2O$ gas. A mixed gas of $N_2O$ and $SiH_4$ was used for the deposition of the $SiO_2$ layer, and a mixed gas of $SiH_4$, $N_2$, and $NH_3$ was used for the deposition of the SiN layer. In both cases, the film deposition power was set to 100 W, and the film deposition temperature was set to 150° C.

Then, a contact hole 7 to be used for probing to evaluate transistor characteristics was formed in the passivation layer 6 by photolithography and dry etching. Then, an ITO film (80 nm in film thickness) was formed as a transparent conductive film 8 by a DC sputtering method under the conditions: carrier gas, a mixed gas of argon gas and oxygen gas; film deposition power, 200 W; and gas pressure, 5 mTorr. Thus, TFTs as shown in FIG. 1 were produced to make the tests described below.

The presence of an oxidatively-treated layer on the surface of the first oxide semiconductor layer was examined by XPS (X-ray photoelectron spectroscopy) measurement. As a result, the peak intensity of oxygen content (atomic %) in the near-surface (5 nm) region was not higher by at least 2 atomic % as compared with the peak intensity of oxygen content (atomic %) in the region other than the near-surface region, thereby confirming that no oxidatively-treated layer was formed.

The respective metal element contents (atomic ratios) of the first oxide semiconductor layer 4' and the second oxide semiconductor layer 4 were analyzed by an XPS (X-ray Photoelectron Spectroscopy) method.

For each of the TFTs thus obtained, transistor characteristics were measured as described in (1) below, and then, (2) carrier mobility (electron field-effect mobility), (3) SS value, and (4) stress stability were evaluated.

(1) Measurement of Transistor Characteristics

The transistor characteristics (drain current—gate voltage characteristics, Id-Vg characteristics) were measured using a semiconductor parameter analyzer "4156C" available from Agilent Technology. The detailed measurement conditions were as follows:

Source voltage: 0 V
Drain voltage: 10 V
Gate voltage: from −30 to 30 V (measurement interval: 0.25 V)

(2) Carrier Mobility (Electron Field-Effect Mobility)

The carried mobility (electron field-effect mobility) was calculated in the saturation region using the equation (1) below.

[Equation 1]

$$I_d = \frac{1}{2}\mu_{FE}C_{OX}\frac{W}{L}(V_{gs}-V_{th})^2 \tag{1}$$

In equation (1),
$I_d$: drain current
$\mu_{FE}$: electron field-effect mobility (saturation mobility)
$C_{ox}$: insulator layer capacitance
W: channel width
L: channel length
$V_{gs}$: gate voltage
$V_{th}$: threshold voltage In the present Examples, the samples were evaluated as "○" (having high mobility) when the saturation mobility thus obtained was 5 $cm^2$/Vs or more, or as "x" when the saturation mobility thus obtained was lower than 5 $cm^2$/Vs.

(3) SS Value

The SS value was defined as the minimum value of the gate voltage necessary for increasing the drain current by one digit. In the present Examples, the samples were evaluated as "○" (having small SS values) when the SS value thus obtained was 1.0 V/decade or lower, or as "x" when the SS value thus obtained was higher than 1.0 V/decade.

(4) Evaluation of Stress Stability (Light Irradiation and Negative Bias were Applied as Stress)

In the present Examples, stress application tests were carried out by light irradiation while applying negative bias to the gate electrode for simulation of environments (stress) at the time of actual panel drive. The stress application conditions were as described below. As the wavelength of light, about 400 nm was selected, which is near the band gaps of oxide semiconductors and at which transistor characteristics may easily vary.

Gate voltage: −20 V
Source voltage: 0V
Drain voltage: 10 V
Substrate temperature: 60° C.
Light stress
Wavelength: 400 nm
Illuminance (intensity of light irradiated onto TFTs): 0.1 μW/cm$^2$
Light source: LED available from OPTOSUPPLY Ltd. (light intensity was adjusted with an ND filter)
Stress application time: 3 hours In the present Examples, the voltage when the drain current was around 1 nA between the ON-current and the OFF-current was defined as threshold voltage, and the variation (shift amount) of threshold voltage before and after the stress application was measured. The threshold voltage as used herein is liberally interpreted as the value of gate voltage when transistor shifts from an OFF state (a state in which the drain current is low) to an ON state (a state in which the drain current is high). In the present Examples, the samples were evaluated as "○" when the shift amount thus obtained was 5V or lower (being excellent in stress stability), or as "x" when the shift amount thus obtained was higher than 5V.

These results are shown together in Tables 1 to 5.

TABLE 1

| | Second oxide semiconductor layer Composition of IGZO (atomic ratio) | | | First oxide semiconductor layer Composition of AZO (atomic ratio) | | TFT characteristics | | | |
|---|---|---|---|---|---|---|---|---|---|
| No. | In | Ga | Zn | Zn/(Zn + Al) | Al/(Zn + Al) | Mobility | SS value | Stress stability | Total judgment |
| 1 | 1 | 1 | 1 | — | — | x | x | x | x |
| 2 | 1 | 1 | 1 | 0.25 | 0.75 | x | x | x | x |
| 3 | 1 | 1 | 1 | 0.5 | 0.5 | ○ | ○ | ○ | ○ |
| 4 | 1 | 1 | 1 | 0.75 | 0.25 | ○ | ○ | ○ | ○ |
| 5 | 1 | 1 | 1 | 1 | 0 | ○ | ○ | ○ | ○ |
| 6 | 2 | 2 | 1 | — | — | x | x | x | x |
| 7 | 2 | 2 | 1 | 0.25 | 0.75 | x | x | x | x |
| 8 | 2 | 2 | 1 | 0.5 | 0.5 | ○ | ○ | ○ | ○ |
| 9 | 2 | 2 | 1 | 0.75 | 0.25 | ○ | ○ | ○ | ○ |
| 10 | 2 | 2 | 1 | 1 | 0 | ○ | ○ | ○ | ○ |

TABLE 2

| | Second oxide semiconductor layer Composition of IGZO (atomic ratio) | | | First oxide semiconductor layer Composition of GZO (atomic ratio) | | TFT characteristics | | | |
|---|---|---|---|---|---|---|---|---|---|
| No. | In | Ga | Zn | Zn/(Zn + Ga) | Ga/(Zn + Ga) | Mobility | SS value | Stress stability | Total judgment |
| 1 | 1 | 1 | 1 | — | — | x | x | x | x |
| 2 | 1 | 1 | 1 | 0.25 | 0.75 | x | x | x | x |
| 3 | 1 | 1 | 1 | 0.5 | 0.5 | ○ | ○ | ○ | ○ |
| 4 | 1 | 1 | 1 | 0.75 | 0.25 | ○ | ○ | ○ | ○ |
| 5 | 1 | 1 | 1 | 1 | 0 | ○ | ○ | ○ | ○ |
| 6 | 2 | 2 | 1 | — | — | x | x | x | x |
| 7 | 2 | 2 | 1 | 0.25 | 0.75 | x | x | x | x |
| 8 | 2 | 2 | 1 | 0.5 | 0.5 | ○ | ○ | ○ | ○ |
| 9 | 2 | 2 | 1 | 0.75 | 0.25 | ○ | ○ | ○ | ○ |
| 10 | 2 | 2 | 1 | 1 | 0 | ○ | ○ | ○ | ○ |

TABLE 3

| | Second oxide semiconductor layer Composition of IGZO (atomic ratio) | | | First oxide semiconductor layer Composition of ZTO (atomic ratio) | | TFT characteristics | | | |
|---|---|---|---|---|---|---|---|---|---|
| No. | In | Ga | Zn | Zn/(Zn + Sn) | Sn/(Zn + Sn) | Mobility | SS value | Stress stability | Total judgment |
| 1 | 1 | 1 | 1 | — | — | x | x | x | x |
| 2 | 1 | 1 | 1 | 0.25 | 0.75 | x | x | x | x |
| 3 | 1 | 1 | 1 | 0.5 | 0.5 | ○ | ○ | ○ | ○ |
| 4 | 1 | 1 | 1 | 0.75 | 0.25 | ○ | ○ | ○ | ○ |
| 5 | 1 | 1 | 1 | 1 | 0 | ○ | ○ | ○ | ○ |
| 6 | 2 | 2 | 1 | — | — | x | x | x | x |
| 7 | 2 | 2 | 1 | 0.25 | 0.75 | x | x | x | x |
| 8 | 2 | 2 | 1 | 0.5 | 0.5 | ○ | ○ | ○ | ○ |

TABLE 3-continued

| | Second oxide semiconductor layer Composition of IGZO (atomic ratio) | | | First oxide semiconductor layer Composition of ZTO (atomic ratio) | | TFT characteristics | | | |
|---|---|---|---|---|---|---|---|---|---|
| No. | In | Ga | Zn | Zn/(Zn + Sn) | Sn/(Zn + Sn) | Mobility | SS value | Stress stability | Total judgment |
| 9 | 2 | 2 | 1 | 0.75 | 0.25 | ○ | ○ | ○ | ○ |
| 10 | 2 | 2 | 1 | 1 | 0 | ○ | ○ | ○ | ○ |

TABLE 4

| | Second oxide semiconductor layer Composition of IZO (atomic ratio) | | First oxide semiconductor layer Composition of AZO (atomic ratio) | | TFT characteristics | | | |
|---|---|---|---|---|---|---|---|---|
| No. | In | Zn | Zn/(Zn + Al) | Al/(Zn + Al) | Mobility | SS value | Stress stability | Total judgment |
| 1 | 3 | 1 | — | — | x | x | x | x |
| 2 | 3 | 1 | 0.25 | 0.75 | x | x | x | x |
| 3 | 3 | 1 | 0.5 | 0.5 | ○ | ○ | ○ | ○ |
| 4 | 3 | 1 | 0.75 | 0.25 | ○ | ○ | ○ | ○ |
| 5 | 3 | 1 | 1 | 0 | ○ | ○ | ○ | ○ |
| 6 | 4 | 1 | — | — | x | x | x | x |
| 7 | 4 | 1 | 0.25 | 0.75 | x | x | x | x |
| 8 | 4 | 1 | 0.5 | 0.5 | ○ | ○ | ○ | ○ |
| 9 | 4 | 1 | 0.75 | 0.25 | ○ | ○ | ○ | ○ |
| 10 | 4 | 1 | 1 | 0 | ○ | ○ | ○ | ○ |
| 11 | 5 | 1 | — | — | x | x | x | x |
| 12 | 5 | 1 | 0.25 | 0.75 | x | x | x | x |
| 13 | 5 | 1 | 0.5 | 0.5 | ○ | ○ | ○ | ○ |
| 14 | 5 | 1 | 0.75 | 0.25 | ○ | ○ | ○ | ○ |
| 15 | 5 | 1 | 1 | 0 | ○ | ○ | ○ | ○ |

TABLE 5

| | Second oxide semiconductor layer Composition of IZO (atomic ratio) | | First oxide semiconductor layer Composition of GZO (atomic ratio) | | TFT characteristics | | | |
|---|---|---|---|---|---|---|---|---|
| No. | In | Zn | Zn/(Zn + Ga) | Ga/(Zn + Ga) | Mobility | SS value | Stress stability | Total judgment |
| 1 | 3 | 1 | — | — | x | x | x | x |
| 2 | 3 | 1 | 0.25 | 0.75 | x | x | x | x |
| 3 | 3 | 1 | 0.5 | 0.5 | ○ | ○ | ○ | ○ |
| 4 | 3 | 1 | 0.75 | 0.25 | ○ | ○ | ○ | ○ |
| 5 | 3 | 1 | 1 | 0 | ○ | ○ | ○ | ○ |
| 6 | 4 | 1 | — | — | x | x | x | x |
| 7 | 4 | 1 | 0.25 | 0.75 | x | x | x | x |
| 8 | 4 | 1 | 0.5 | 0.5 | ○ | ○ | ○ | ○ |
| 9 | 4 | 1 | 0.75 | 0.75 | ○ | ○ | ○ | ○ |
| 10 | 4 | 1 | 1 | 0 | ○ | ○ | ○ | ○ |
| 11 | 5 | 1 | — | — | x | x | x | x |
| 12 | 5 | 1 | 0.25 | 0.75 | x | x | x | x |
| 13 | 5 | 1 | 0.5 | 0.5 | ○ | ○ | ○ | ○ |
| 14 | 5 | 1 | 0.75 | 0.25 | ○ | ○ | ○ | ○ |
| 15 | 5 | 1 | 1 | 0 | ○ | ○ | ○ | ○ |

In each table, the "composition of first oxide semiconductor layer=-" (e.g., No. 1 in Table 1) means an example in which only the second oxide semiconductor layer was used as the semiconductor layer and the first oxide semiconductor layer was not formed, and corresponds to a conventional example.

From Tables 1 to 5, discussion can be made as follows: More specifically, the examples in which the first oxide semiconductor layer had a Zn content of 50 atomic % or more as a percentage of all metal elements contained therein were excellent in TFT characteristics, whereas the examples in which the first oxide semiconductor layer had a Zn content of lower than 50 atomic % as a percentage of all metal elements contained therein did not fulfill the passing criteria for any of saturation mobility, SS value, and stress stability, thereby being inferior in TFT characteristics.

DESCRIPTION OF REFERENCE NUMERALS

1 Substrate
2 Gate electrode
3 Gate insulator layer
4 Second oxide semiconductor layer
4' First oxide semiconductor layer
5 Source-drain electrode
6 Passivation layer
7 Contact hole
8 Transparent conductive film
9 Etch stop layer

The invention claimed is:

1. A thin-film transistor structure, comprising, on a substrate, in order from the substrate side:
an oxide semiconductor layer;
a source-drain electrode; and
a passivation layer,
wherein:
the oxide semiconductor layer is a stacked product of a first oxide semiconductor layer and a second oxide semiconductor layer;
the first oxide semiconductor layer consists of, as a metal element, Zn; or Zn and at least one element selected from the group consisting of Al, Ga, and Sn, wherein a content of Zn is 50 atomic % or more as a percentage of all metal elements contained therein,
the first oxide semiconductor layer is formed on the source-drain electrode and passivation layer side;
the second oxide semiconductor layer consists of, as a metal element, at least one selected from the group consisting of In, Ga, and Zn, and the second oxide semiconductor layer is formed on the substrate side;
and
the first oxide semiconductor layer is in direct contact both with the source-drain electrode and with the passivation layer.

2. The thin-film transistor structure according to claim 1, wherein the passivation layer is formed by a CVD (Chemical Vapor Deposition) method.

3. A thin-film transistor, comprising the thin-film transistor structure of claim 1.

4. A display device, comprising the thin-film transistor of claim 3.

5. The thin-film transistor structure according to claim 1, wherein the first oxide semiconductor layer has a Zn content of 60 atomic % or more as a percentage of all metal elements contained therein.

6. The thin-film transistor structure according to claim 1, wherein the first oxide semiconductor layer has a Zn content of 75 atomic % or more as a percentage of all metal elements contained therein.

7. The thin-film transistor structure according to claim 1, wherein the first oxide semiconductor layer has a film thickness of from 5 nm or more to 80 nm or less.

8. The thin-film transistor structure according to claim 1, wherein the second oxide semiconductor layer has a film thickness of from 30 nm or more to 200 nm or less.

9. A thin-film transistor structure, comprising, on a substrate, in order from the substrate side:
an oxide semiconductor layer;
an etch stop layer; and
a source-drain electrode,
wherein:
the oxide semiconductor layer is a stacked product of a first oxide semiconductor layer and a second oxide semiconductor layer;
the first oxide semiconductor layer consists of, as a metal element, Zn; or Zn and at least one element selected from the group consisting of Al, Ga, and Sn, wherein a content of Zn is 50 atomic % or more as a percentage of all metal elements contained therein,
the first oxide semiconductor layer is formed on the etch stop layer and source-drain electrode side;
the second oxide semiconductor layer consists of, as a metal element, at least one selected from the group consisting of In, Ga, and Zn, and the second oxide semiconductor layer is formed on the substrate side;
and
the first oxide semiconductor layer is in direct contact both with the etch stop layer and with the source-drain electrode.

10. The thin-film transistor structure according to claim 9, wherein the etch stop layer is formed by a CVD (Chemical Vapor Deposition) method.

11. A thin-film transistor, comprising the thin-film transistor structure of claim 9.

12. A display device, comprising the thin-film transistor of claim 11.

13. The thin-film transistor structure according to claim 9, wherein the first oxide semiconductor layer has a Zn content of 60 atomic % or more as a percentage of all metal elements contained therein.

14. The thin-film transistor structure according to claim 9, wherein the first oxide semiconductor layer has a Zn content of 75 atomic % or more as a percentage of all metal elements contained therein.

15. The thin-film transistor structure according to claim 9, wherein the first oxide semiconductor layer has a film thickness of from 5 nm or more to 80 nm or less.

16. The thin-film transistor structure according to claim 9, wherein the second oxide semiconductor layer has a film thickness of from 30 nm or more to 200 nm or less.

* * * * *